United States Patent
Kananen et al.

(10) Patent No.: US 6,453,309 B1
(45) Date of Patent: Sep. 17, 2002

(54) METHOD FOR CORRECTING ERRORS IN PARALLEL A/D CONVERSION, CORRECTOR AND PARALLEL A/D CONVERTER

(75) Inventors: Asko Kananen, Helsinki; Ari Paasio, Turku; Saska Lindfors, Espoo; Kari Halonen, Helsinki, all of (FI)

(73) Assignee: Nokia Mobile Phones Limited (FI)

( * ) Notice: Subject to any disclaimer, the term of this patent is extended or adjusted under 35 U.S.C. 154(b) by 0 days.

(21) Appl. No.: 09/310,640

(22) Filed: May 12, 1999

(30) Foreign Application Priority Data

May 13, 1998 (FI) ................................................ 981059

(51) Int. Cl.$^7$ ............................................. G06F 9/445
(52) U.S. Cl. ......................................... 706/41; 341/155
(58) Field of Search .............................. 706/38, 29, 20, 706/26, 41; 341/155

(56) References Cited

U.S. PATENT DOCUMENTS

| | | | | |
|---|---|---|---|---|
| 4,947,482 A | * | 8/1990 | Brown ........................ | 708/801 |
| 4,962,342 A | * | 10/1990 | Mead et al. ................... | 706/33 |
| 5,018,184 A | * | 5/1991 | Abrams et al. ........... | 379/29.05 |
| 5,140,670 A | * | 8/1992 | Chua et al. ................... | 706/29 |
| 5,191,331 A | | 3/1993 | Karema et al. ............. | 341/131 |
| 5,248,972 A | | 9/1993 | Karema et al. ............. | 341/143 |
| 5,311,179 A | * | 5/1994 | Vaisanen et al. ............ | 341/118 |
| 5,331,321 A | | 7/1994 | Mannonen ................... | 341/110 |
| 5,355,528 A | * | 10/1994 | Roska et al. .................. | 706/38 |
| 5,515,477 A | * | 5/1996 | Sutherland ................... | 706/41 |
| 5,564,115 A | * | 10/1996 | Clarkson ..................... | 706/28 |
| 5,671,336 A | * | 9/1997 | Yoshida et al. .............. | 706/30 |
| 5,701,106 A | * | 12/1997 | Pikkarainen et al. ........ | 332/100 |
| 5,717,834 A | * | 2/1998 | Werblin et al. .............. | 706/16 |
| 5,719,955 A | * | 2/1998 | Mita .......................... | 382/158 |
| 5,731,772 A | | 3/1998 | Mikkola et al. ............. | 341/118 |
| 5,734,683 A | * | 3/1998 | Hulkko et al. ............... | 375/316 |
| 5,764,858 A | * | 6/1998 | Sheu et al. ................... | 706/26 |
| 5,786,782 A | * | 7/1998 | Ostman et al. .............. | 341/141 |

FOREIGN PATENT DOCUMENTS

WO          WO 94/09441          4/1994

OTHER PUBLICATIONS

CNN state equations for binocular stereo vision, Tanaka, M.; Awata, M.; Kanaya, M., Neural Networks, 1994. IEEE World Congress on Computational Intelligence., 1994 IEEE International Conference , vol. 3, 1994, pp.: 1929–1934 vol.3.*

Proceedings of the 35th Midwest Symposium on Circuits and Systems (Cat. No.92CH3099–9) Circuits and Systems, 1992., Proceedings of the 35th Midwest Symposium on , 1992.*

Institution of Electrical Engineers, INSPEC Abstract Number: C9704–5190–019, "CNN chip set architectures and the visual mouse", T. Roska, No date.

"A 48 By 48 Cell CMOS Cellular Neural Network Chip", Paasio et al., Hut IRC Radio Communications Research Workshop, Oct. 17, 1997, pp. 33–34.

Finnish Search Report, Application Number 981059, Mar. 2, 1999.

* cited by examiner

Primary Examiner—Thomas Black
Assistant Examiner—Michael B. Holmes
(74) Attorney, Agent, or Firm—Perman & Greene, LLP

(57) ABSTRACT

The invention pertains to a method and corrector (IC6) for correcting an error in a parallel analog-to-digital conversion. Such a correctable error is caused by uncertainties in the reading of the states of parallel comparing elements (IC1, IC2, IC3, IC4) in the converter, said uncertainties being brought about by nonideality, such as non-simultaneous state latching. This error is corrected using a nonlinear cellular neural network preferably such that the real level of the phenomenon compared by means of comparing elements (IC1, IC2, IC3, IC4) is estimated by estimating the states corresponding to correct reading of the comparing elements (IC1, IC2, IC3, IC4) read temporally or otherwise erroneously.

12 Claims, 5 Drawing Sheets

025 # METHOD FOR CORRECTING ERRORS IN PARALLEL A/D CONVERSION, CORRECTOR AND PARALLEL A/D CONVERTER

CROSS-REFERENCES TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of the Invention

The invention relates to a method for correcting an error in fast parallel analog-to-digital conversion, and to a mixed-mode corrector for error correcting to be used particularly in mobile communications devices, and to a parallel A/D converter which uses the corrector according to the invention.

2. Description of the Related Art Including Information Disclosed Under 37 CFR 1.97 and 1.98

From the prior art it is known fast parallel A/D conversion, or flash A/D conversion, wherein multiple comparators are used. In a conversion the resolution of which is N bits, $2^N-1$ reference signals are compared to the input signal, the reference signals being reference voltages having evenly increasing voltages. This technique is generally used in digital video equipment. The maximum speed of the converter is usually 15 to 300 million samples per second (MSPS).

Figure 1:
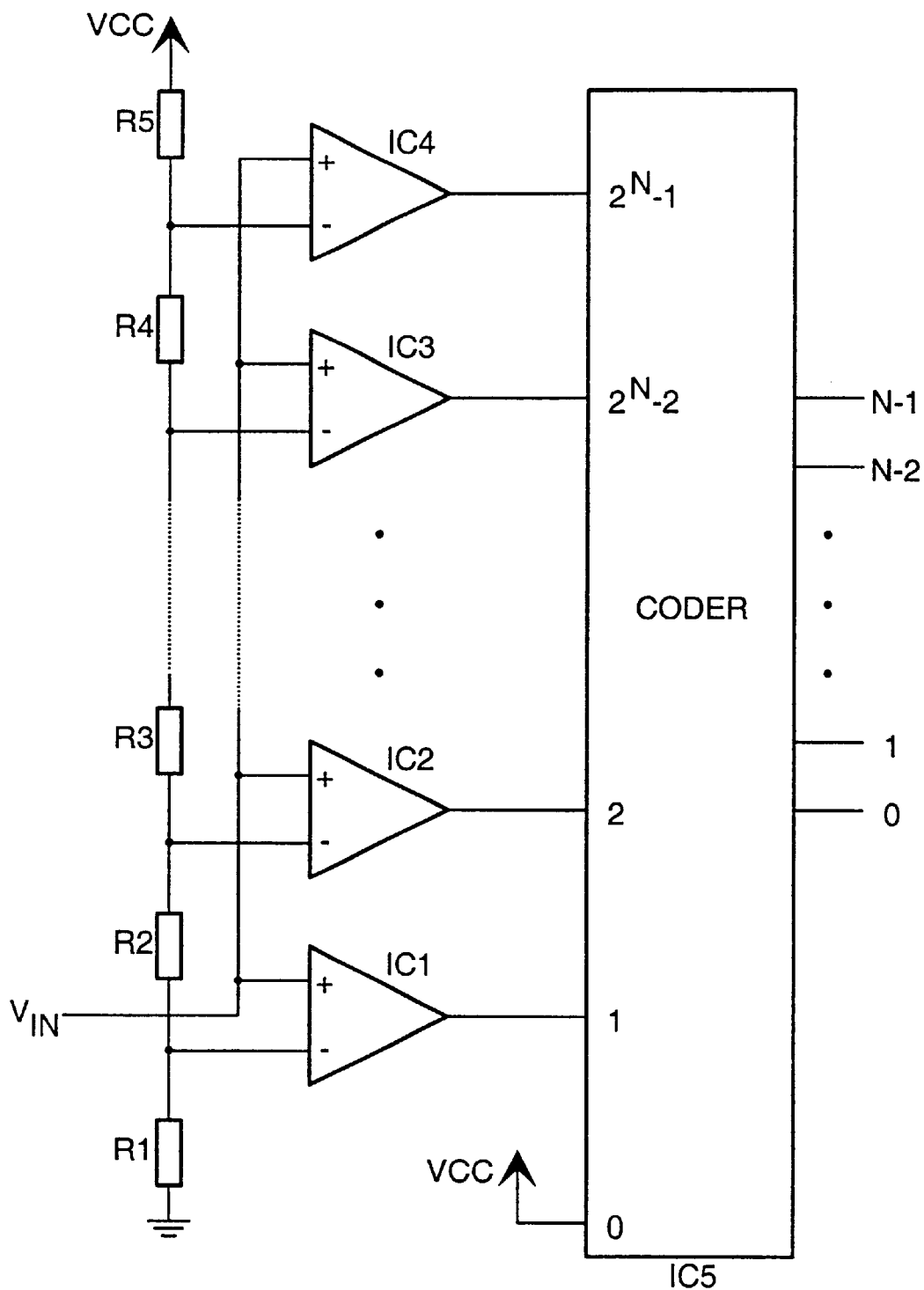

FIG. 1 shows a prior-art parallel A/D converter. The series arrangement of resistors R1, R2, R3, R4 and R5 produces at the connection points steadily-rising reference voltages such that the values of the first resistor R1 and last resistor R5 in the ladder are half the values of intermediate resistors R2, R3 and R4. Naturally there are more intermediate resistors if there are more comparators than shown in FIG. 1. The second input signal of comparators IC1, IC2, IC3 and IC4 is an analog signal $V_{IN}$ to be converted which is compared to the reference voltages mentioned above. As the analog signal voltage $V_{IN}$ rises, the inputs of the comparators change one after the other from zero to one, i.e. from ground to operating voltage. Coder IC5 latches the output signals of the comparators at sampling decision moments into memory and converts the information stored to an N-bit byte of binary code.

A problem with known fast A/D converters are conversion errors caused by inaccurate timing of state transitions of individual comparators. Inaccuracy can be caused by clock jitter, among other things, and it may result in non-simultaneous comparator state transitions. As the analog signal level changes, non-simultaneous comparison may cause bubbles in the so-called thermometer code produced by comparator outputs. This is illustrated in the table below which shows six erroneous sets of output signals in the first columns and the best guess in the last column on the right. A set comprises 14 comparator output signals. The correct voltage level is seen on the horizontal line.

TABLE 1

Examples of comparator errors in known A/D converter

| 0 | 0 | 0 | 0 | 1 | 0 | 0 |
| 0 | 0 | 1 | 0 | 1 | 0 | 0 |
| 0 | 0 | 0 | 0 | 0 | 0 | 0 |
| 0 | 0 | 0 | 0 | 0 | 0 | 0 |
| 0 | 0 | 0 | 0 | 0 | 0 | 0 |
| 0 | 0 | 0 | 1 | 0 | 0 | 0 |
| 1 | 0 | 0 | 1 | 0 | 0 | 0 |
|   |   |   |   |   |   |   |
| 0 | 1 | 1 | 0 | 1 | 1 | 1 |
| 1 | 1 | 1 | 0 | 1 | 1 | 1 |
| 1 | 0 | 1 | 1 | 1 | 1 | 1 |
| 1 | 1 | 1 | 1 | 1 | 1 | 1 |
| 1 | 1 | 1 | 1 | 1 | 0 | 1 |
| 1 | 1 | 1 | 1 | 1 | 0 | 1 |
| 1 | 1 | 1 | 1 | 1 | 0 | 1 |

In the first column of Table 1 the six lowest values are correct but the seventh value is erroneously zero, where ideal comparison would yield one. The next output is again one, but it should be zero. The six topmost outputs are correctly zeros. So, the A/D converter gives an inaccurate result. The next five columns show other possible error results. The last column on the right-hand side shows the ideal result. Several methods have been developed for error correcting in a parallel converter but they all involve a great number of logic circuits between the comparators and latch circuits.

It is an object of the invention to eliminate the above-mentioned inaccuracy with a reasonable amount of circuitry.

BRIEF SUMMARY OF THE INVENTION

The invention pertains to a method for correcting an error in a parallel analog-to-digital conversion wherein the error is caused by uncertainty in the reading of the states of parallel comparators in the converter, said uncertainty being the result of nonideality, such as non-simultaneous state latching. In accordance with the invention the error is corrected using a cellular nonlinear neural network.

The invention also pertains to a corrector for correcting an error in a parallel analog-to-digital converter, said corrector including parallel comparing elements which have uncertainty error, such as non-simultaneous state latching, in comparison state reading. According to the invention the corrector comprises a cellular neural net-work for reducing the error caused by the uncertainty of the output state control of individual comparing elements by estimating the real comparison result on the basis of the state of the comparing element and its neighbourhood.

The invention also pertains to a parallel A/D converter that includes a corrector for correcting an error in a parallel analog-to-digital converter, said converter including parallel comparing elements which have uncertainty error, such as non-simultaneous state latching, in comparison state reading. In accordance with the invention the corrector includes a cellular neural network for reducing the error caused by the uncertainty in the reading of the states of individual comparing elements by estimating the real comparison result on the basis of the state of the comparing element and its neighbourhood.

Preferred embodiments of the invention are described in the dependent claims.

An information processing network modelled after the biological neural network is called a neural network. Computing by means of neural networks is considerably faster than serial information processing as the former functions parallely such that information is processed simultaneously in each computing unit. Neural networks are also advantageously capable of generalizing calculation which is considerably more difficult using conventional computing algorithms.

The invention utilizes a cellular neural network designed mainly for image processing wherein one computing unit is called a cell. The cells are arranged into a certain shape, such as a two-dimensional quadrangular or hexagonal shape. The cellular neural network is one type of neural network, also known as the cellular nonlinear network (CNN). In a nonlinear cellular network the cells get their input from the cells of their neighbourhood, information from the different cells is weighted, and a dynamic state is formed in the cells. A linear or nonlinear function is used in a cell to form a cell state output. The cell output is taken to the neighbourhood cells as input, as described above. This way, the weighted outputs of the neighbourhood cells also affect the dynamic state of a cell. Thus, the cells have one input signal and one output signal and, in addition, connections to their specified neighbourhood.

A cellular neural network can be programmed to carry out various computational tasks by weighting the signals from the neighbourhood in various manners. Advanced cellular neural networks can be integrated more compactly than the original ones. Advanced cellular neural networks, such as the full signal range (FSR), high gain, positive range, and positive range high gain network, can be integrated on a microcircuit more compactly than the original ones. The invention is preferably implemented using a positive range high gain cellular neural network wherein the cell output signal level extends from zero to one and changes as a bistable state, i.e. such that no permanent intermediate states are specified.

The cellular neural network theory and cellular nonlinear network are also discussed in patent documents U.S. Pat. Nos. 5,140,670, 5,355,528 and 5,717,834.

In accordance with the invention, a one-dimensional neural network is preferably used which has one cell per each comparing element. The neural network gets its input from the comparators and sends its output to the coder. Input signals from the comparators are latched such that the input signals remain in constant state during the correction computing carried out by the neural network and change again for the next sample. Similarly, output signals sent to the coder are latched such that the output signals remain in constant state during the correction computing carried out by the neural network and change when the correction computing is finished.

It is an advantage of the invention that fast A/D conversion can be made accurate by correcting the "bubbles" caused by one or more erroneous comparator outputs.

BRIEF DESCRIPTION OF THE SEVERAL VIEWS OF THE DRAWING(S)

Figure 2:
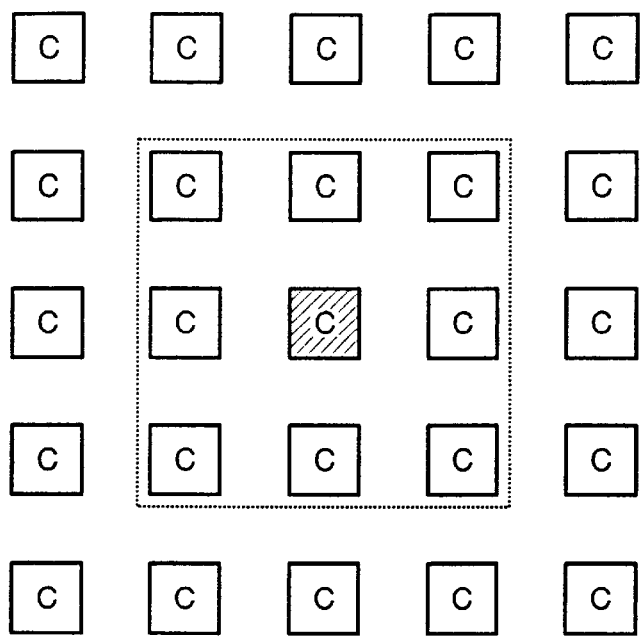
Figure 6:
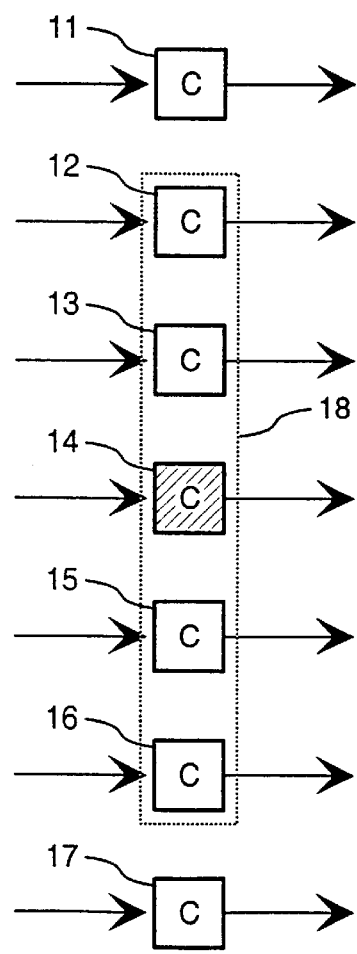
Figure 3:
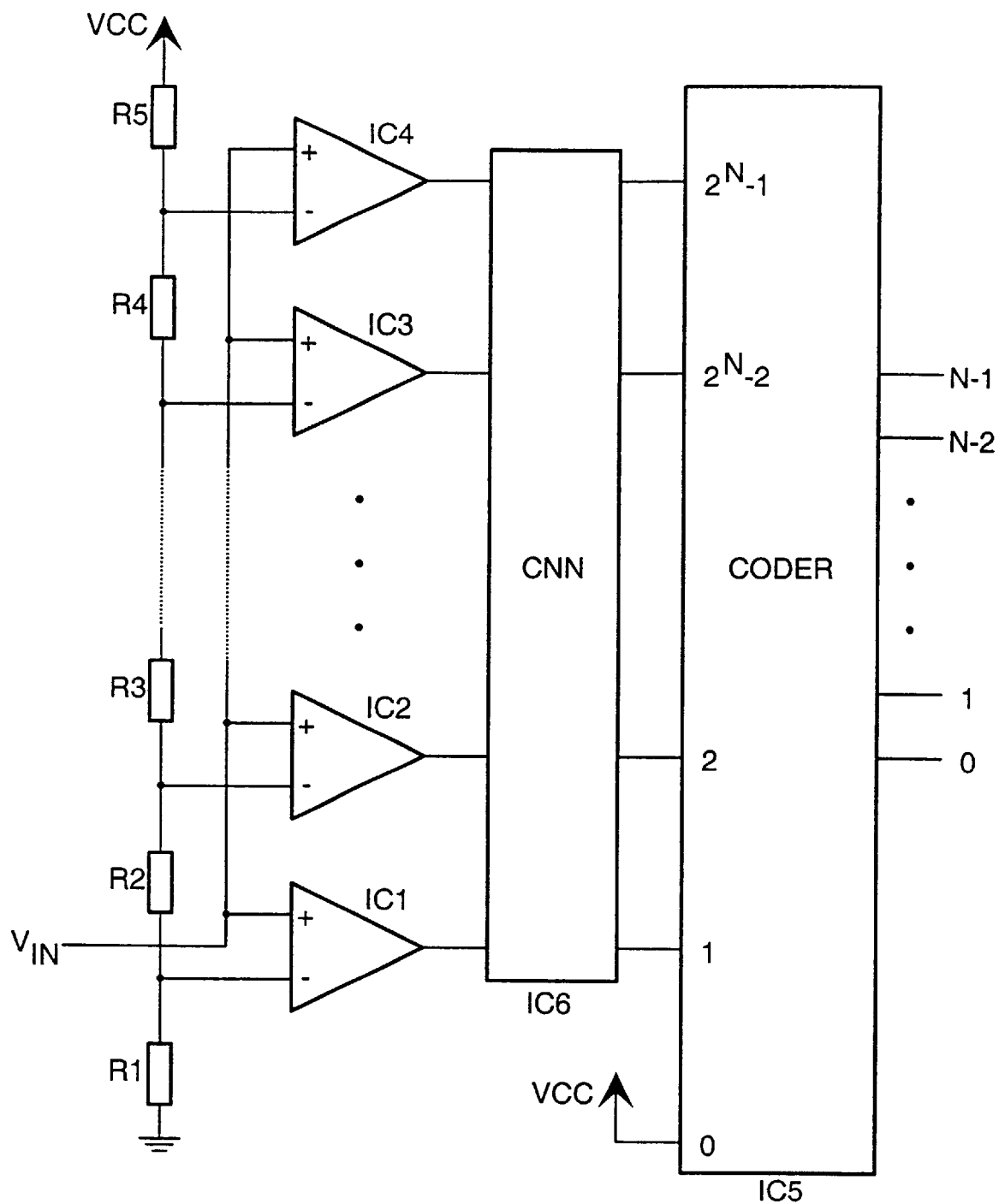
Figure 4:
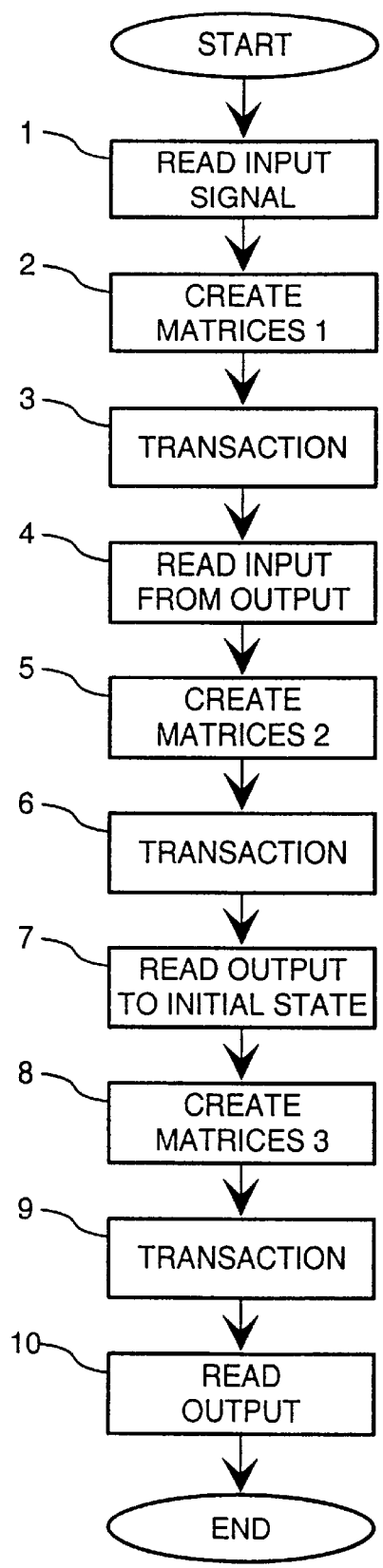
Figure 5:
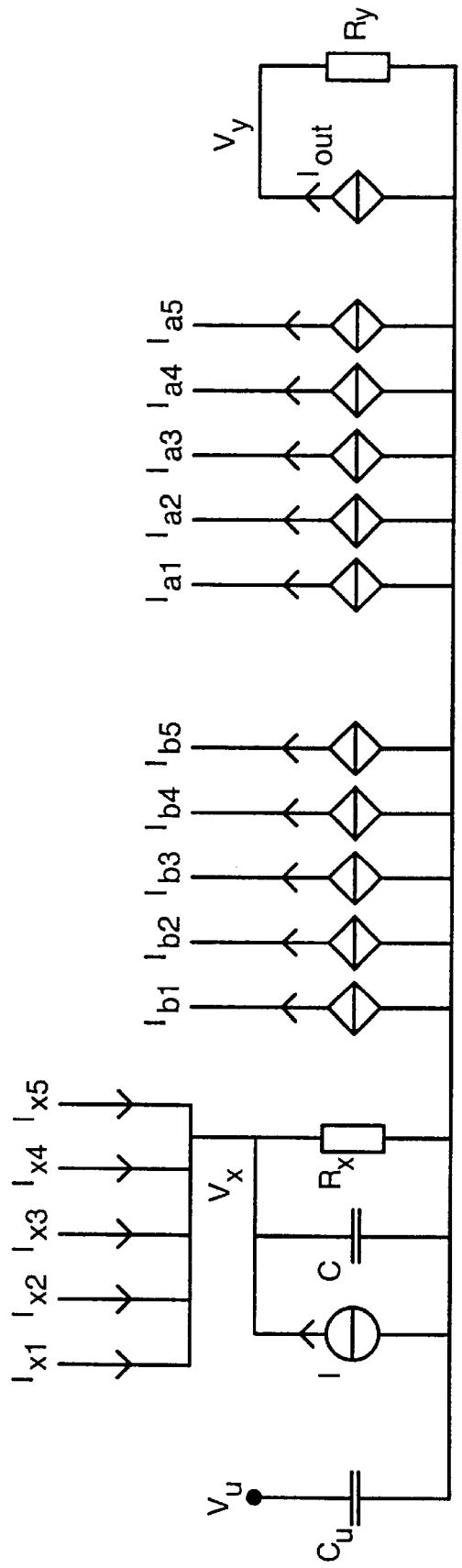

The invention will now be described in more detail with reference to the accompanying drawing wherein FIG. 1 shows in the form of circuit diagram a known A/D converter, FIG. 2 shows a two-dimensional neural network, FIG. 3 shows in the form of circuit diagram a parallel A/D converter according to the invention, FIG. 4 illustrates in the form of flow diagram a method according to the invention, FIG. 5 illustrates the operating principle of a neural network cell, and FIG. 6 shows a neighbourhood according to the invention.

DETAILED DESCRIPTION OF THE INVENTION

FIG. 1 was discussed above in conjunction with the description of the prior art.

FIG. 2 shows a quadrangular two-dimensional 5×5 cellular network. In a cellular neural network a neighbourhood refers to the cells with which a particular cell has connections apart from its input and output signals. In the two-dimensional form a cell has neighbours at all sides, as can be seen in FIG. 2. The hatched cell C in the middle is the cell examined and the broken line defines the neighbourhood, which in this case extends one cell away.

FIG. 3 shows in the form of circuit diagram a parallel A/D converter which includes a mixed mode corrector IC6 according to the invention between the comparing elements IC1, IC2, IC3, IC4 and the coder IC5.

FIG. 4 illustrates in the form of flow diagram a method according to the invention. Error correction is here divided into three stages such that at the first stage small one-comparator errors are corrected, at the second stage two-comparator errors, and at the third stage the correction of two-comparator errors continues. The second and third stages together correct a situation wherein the outputs of three adjacent comparators erroneously have zeros. All correction stages are position independent.

The following coefficients A, B and I are used in the computing:

$$A = \begin{bmatrix} a_1 \\ a_2 \\ a_3 \\ a_4 \\ a_5 \end{bmatrix} \quad B = \begin{bmatrix} b_1 \\ b_2 \\ b_3 \\ b_4 \\ b_5 \end{bmatrix} \quad I = I_1 \tag{1}$$

In the coefficients, the elements $a_1$, $a_2$, $a_3$, $a_4$, $a_5$ of matrix A serve as coefficients for the preceding outputs of the neighbourhood cells. In the coefficients, the elements $b_1$, $b_2$, $b_3$, $b_4$, $b_5$ of matrix B serve as coefficients for the inputs of the neighbourhood cells. The outputs of the cells of the neighbourhood multiplied by the coefficients produce a result into which constant I is added. Values of the coefficient elements are relative and multiples of the unit quantity to be determined. Thus, the output of the middle cell is zero when the result is smaller than zero, or one when the result is greater than zero.

The state of a cell can be modelled using the equation $$C \frac{dv_x(t)}{dt} = -\frac{1}{R_x} v_x(t) + \sum_{C_k \in N_T} A(k) v_{y_k}(t) + \sum_{C_k \in N_T} B(k) v_{u_k}(t) + I \tag{2}$$

wherein the derivate for state $v_x$ of cell $C_k$ is determined in relation to time at moment t. C is the value of the capacitance of the integrating element of the cell, which gives the cell's time constant when multiplied by quantity $R_x$. The four terms on the right-hand side of the equation are from left to right: the loss term, share of neighbourhood outputs, share of neighbourhood inputs, and the level adjustment term. In the terms mentioned above, $v_x$, $v_y$ and $v_u$ are voltages appearing later on in FIG. 5. The equation sums the effect of voltages $v_y$ and $v_u$ of the cells in the neighbourhood $N_T$ on the state of the cell examined using tile corresponding coefficients of matrices A and B. Summed also is the current according to coefficient I.

Operation starts by first reading 1 the input signal from the comparing elements. Next, matrices are formed preferably using tile values below:

$$A = [0] \quad B = \begin{bmatrix} 0 \\ 2 \\ 2 \\ 2 \\ 0 \end{bmatrix} \quad I = -3 \tag{3}$$

Cell output states are computed 3 according to the matrices (3). At this stage, errors of the size of one comparing element, i.e. errors not including adjacent erroneous comparison results (erroneous in the same direction, that is), are corrected.

After the computation, cell input is read 4 from the outputs according to the previous computation of neighbourhood cells. Next, matrices are formed preferably using the values below:

$$A = [0] \quad B = \begin{bmatrix} 2 \\ 2 \\ 2 \\ 0 \\ 0 \end{bmatrix} \quad I = -1 \tag{4}$$

Cell output states are computed 6 according to the matrices (4). At this stage, errors of the size of two comparing element zeros are corrected. The cell output state following the computation is read 7 into cell initial state. Step 7 may be carried out automatically depending on the circuit arrangement in use. Next, matrices are formed preferably using the values below:

$$A = \begin{bmatrix} 2 \\ 0 \\ 2 \\ 0 \\ 0 \end{bmatrix} \quad B = \begin{bmatrix} 2 \\ 0 \\ 0 \\ 0 \\ 2 \end{bmatrix} \quad I = -3 \tag{5}$$

Final computing is carried out 8 for cell output states according to the matrices (5). At this stage it is checked whether there was initially a situation with two adjacent erroneous comparison results of two errors (in opposite directions), and errors with three adjacent zeros are corrected. Finally, cell outputs are read 9.

The following coefficients A, B and I can be used instead of matrices (3), (4) and (5) to compute in one step:

$$A = [0] \quad B = \begin{bmatrix} 2 \\ 2 \\ 2 \\ 0 \setminus -2 \\ 0 \setminus -2 \end{bmatrix} \quad I = -1 \tag{6}$$

The three upper factors of the coefficient B are normal in function. The two lower factors are 0 when input is 1 and -2 when input is 0.

Also the following normal coefficients A, B and I can be used instead of matrices (3), (4) and (5) to compute in one step:

$$A = [0] \quad B = \begin{bmatrix} 2 \\ 2 \\ 2 \\ 2 \\ 2 \end{bmatrix} \quad I = -5 \tag{7}$$

An advantage in the coefficient sets (6) and (7) is one phase operation and ease of implementation. The functional steps 4 to 9 are not executed. A disadvantage is correction ability for processing only one or two erroneous adjacent comparator outputs instead of three.

FIG. 5 shows a diagram illustrating the operating principle of a cell in a neural network according to the original theory wherein the size of the neighbourhood is 2. Voltage $v_u$ across capacitance $C_u$ in accordance with the comparison state is taken from a comparator to the cell input line. According to the original theory the voltage $v_u$ could vary freely between [-1, 1], but in accordance with the invention, it varies preferably only according to the comparators digital output such that its value is either zero or one. Voltage $v_u$ controls the voltage-controlled current sources $I_{b1}$, $I_{b2}$, $I_{b4}$, $I_{b5}$ to the neighbourhood cells and current source $I_{b3}$ to the same cell such that voltage $v_u$ is multiplied by the corresponding matrix B coefficient $B_k$ and the input is then taken to the control input of the corresponding voltage-controlled current source. Currents $I_{x1}$, $I_{x2}$, $I_{x4}$, $I_{x5}$ are taken from the neighbourhood cells and current $I_{x3}$ from own cell. Said currents $I_{x1}$, $I_{x2}$, $I_{x3}$, $I_{x4}$, $I_{x4}$ are added to current I and the result is taken to an integrating capacitor C and resistor $R_x$ in parallel with it so that voltage $v_x$ appears across capacitor C. Current I is determined in template I. Voltage $v_x$ is turned into voltage $v_y$ by limiting it by means of a voltage-controlled current source $I_{out}$ and resistor $R_y$ between [-1, 1] at moment t according to the equation below:

$$v_y(t) = f(v_x(t)) = \frac{1}{2}(|v_x(t)+1| - |v_x(t)-1|) \tag{8}$$

Voltage $v_y$ is used to control the voltage-controlled current sources $I_{a1}$, $I_{a2}$, $I_{a4}$, $I_{a5}$ to the neighbourhood cells and current source $I_{a3}$ to the same cell such that voltage $v_y$ is multiplied by the corresponding matrix A coefficient $A_k$ and the input is then taken to the control input of the corresponding voltage-controlled current source. The coefficients A are called feedback terms and the coefficients B control terms. The use of coefficients here refers to the generation of a voltage control to a current source by multiplying the respective common control voltage by the matrix coefficient corresponding to the current source in order to produce the current source specific control voltage. When using the positive range high gain model, the cell output is limited to a step function in the range [0, 1].

FIG. 6 shows seven cells 11, 12, 13, 14, 15, 16, 17 of a one-dimensional neural network according to the invention and therein a two-cell neighbourhood 18 on both sides of the middle cell 14. The neighbourhood cells 12, 13, 15, 16 affect the middle cell 14 in a manner according to matrices A and B and constant I, as was described above in conjunction with the description of FIG. 3. In accordance with their functions, matrix A is called the feedback term and matrix B the control term.

The cellular neural network according to the invention operates in mixed mode, i.e. the internal operation of the network is mainly analog, but the input and output signals are digital.

The properties of the cellular neural network that correct conversion errors can also be modified by altering the size of the neighbourhood.

In accordance with the invention, the parallel A/D converter and neural network are integrated on silicon using e.g. a 0.5 μm line width semiconductor process, but other line widths, too, can be used. In this case, the neural network cells can be realized using 35 transistors, for example.

The invention is not limited to the embodiments described above but many modifications are possible within the scope of the inventional idea defined by the claims set forth below.

What is claimed is:

1. A method for correcting in parallel analog-to-digital conversion an error brought about by uncertainty in the reading of parallel comparing element states in a converter, said uncertainty being caused by nonideality, such as non-simultaneous state latching, characterized in that the error is corrected using a nonlinear cellular neural network.

2. A method according to claim 1, characterized in that the error is corrected by estimating the real level of the phenomenon compared by means of comparing elements by estimating the state corresponding to the correct reading of the comparing elements read erroneously.

3. A method according to claim 1, characterized in that the conversion error-correcting properties of the cellular neural network can be modified by means of programming.

4. A method according to claim 1, characterized in that the conversion error-correcting properties of the cellular neural network can be modified by adjusting the size of the neighbourhood.

5. A method according to claim 4, characterized in that a 1-dimensional 2-neighbourhood system is used.

6. A method according to claim 1, characterized in that erroneous decisions caused by uncertainties in the reading of comparing element states are corrected in three stages such that first (1, 2, 3), minor decision errors of one comparator are corrected, second (4, 5, 6), two-comparator errors are corrected, and third (7, 8, 9, 10), the correction of two-comparator errors continues, so that the second (4, 5, 6) and third (7, 8, 9, 10) stages together correct situations wherein decisions from the reading of three adjacent comparing elements are erroneously zeros.

7. A method according to claim 1, characterized in that erroneous decisions caused by uncertainties in the reading of comparing element states are corrected in one stage such that operation starts by first reading (1) the input signals from the comparing elements, coefficients are formed once (2) using the values:

$$A = [0] \quad B = \begin{bmatrix} 2 \\ 2 \\ 2 \\ 2 \\ 2 \end{bmatrix} \quad I = -5,$$

cell output states are computed (3) according to the coefficients to correct situations wherein decisions from the reading of maximum two adjacent comparing elements are erroneous.

8. A corrector (IC6) for correcting an error in a parallel analog-to-digital converter that comprises parallel comparing elements (IC1, IC2, IC3, IC4) which have uncertainty error, such as non-simultaneous state latching, in comparison state reading, characterized in that the corrector (IC6) comprises a cellular neural network to reduce the error caused by the uncertainty in the reading of the states of individual comparing elements (IC1, IC2, IC3, IC4) by estimating a real comparison result on the basis of the state of the cell (14) corresponding to a comparing element (IC1, IC2, IC3, IC4) and the state of the cell's neighbourhood (12, 13, 15, 16, 18).

9. The corrector of claim 8, characterized in that the cellular neural network (11, 12, 13, 14, 15, 16, 17, 18) is one-dimensional.

10. The corrector of claim 8, characterized in that the cells (11, 12, 13, 14, 15, 16, 17) of the cellular neural network operate on the principle of current summing.

11. The corrector of claim 8, characterized in that the radius of the neighbourhood (18) of the cellular neural network is two cells (12, 13, 15, 16).

12. A parallel A/D converter comprising a corrector (IC6) for correcting an error in a parallel analog-to-digital converter that comprises parallel comparing elements (IC1, IC2, IC3, IC4) which have uncertainty, such as non-simultaneous state latching, in comparison state reading, characterized in that the corrector (IC6) comprises a cellular neural network (11 through 18) to reduce the error caused by the uncertainty in the reading of the states of individual comparing elements (IC1, IC2, IC3, IC4) by estimating the real comparison result on the basis of the state of the cell (14) corresponding to the comparing element and the state of the cell's neighbourhood (12, 13, 15, 16, 18).

* * * * *